United States Patent
Grenier et al.

(10) Patent No.: US 7,260,131 B2
(45) Date of Patent: Aug. 21, 2007

(54) SYMMETRIZATION DEVICE AND LASER DIODE SYSTEM PROVIDED WITH THE SAME

(75) Inventors: Paul Grenier, Sainte-Foy (CA); Yves Taillon, Saint-Augustin-de-Desmaures (CA); Bruno Labranche, Sainte-Foy (CA); Patrice Topart, Cap-Rouge (CA); Daniel Asselin, Saint-Augustin-de-Desmaures (CA)

(73) Assignee: Institut National D'Optique, Quebec (CA)

(*) Notice: Subject to any disclaimer, the term of this patent is extended or adjusted under 35 U.S.C. 154(b) by 314 days.

(21) Appl. No.: 11/035,516

(22) Filed: Jan. 14, 2005

(65) Prior Publication Data
US 2006/0159147 A1 Jul. 20, 2006

(51) Int. Cl.
*H01S 5/00* (2006.01)
(52) U.S. Cl. ............... 372/50.12; 372/15; 372/16; 372/101; 372/9
(58) Field of Classification Search ............ 372/50.12, 372/15, 16, 101, 9
See application file for complete search history.

(56) References Cited

U.S. PATENT DOCUMENTS

| | | | |
|---|---|---|---|
| 5,168,401 A | | 12/1992 | Endriz |
| 5,513,201 A | * | 4/1996 | Yamaguchi et al. .......... 372/75 |
| 5,592,333 A | | 1/1997 | Lewis |
| 6,243,210 B1 | | 6/2001 | Yan |
| 6,324,190 B1 | | 11/2001 | Du et al. |
| 6,471,372 B1 | | 10/2002 | Lissotschenko et al. |
| 6,639,727 B2 | | 10/2003 | Kusuyama |
| 6,680,800 B1 | | 1/2004 | Schreiber et al. |

OTHER PUBLICATIONS

Patrice A. Topart et al., "Replication of micro-optical elements In hybrid organic-Inorganic materials", Chapter 2 (Laser writing of deep microstructures), Proc. SPIE, Jan. 2003, p. 54-55, vol. 4984, Eric G. Johnson Ed.

* cited by examiner

*Primary Examiner*—Dung (Michael) T. Nguyen
(74) *Attorney, Agent, or Firm*—Merchant & Gould P.C.

(57) ABSTRACT

A symmetrization device and laser diode system using such a device is shown. The device has adjacent lens components transforming beamlets from a laser diode array. Each lens component has input and output surfaces, each having a profile in the propagation direction of the beamlets and a contour perpendicularly thereto. The profiles of the input and output surfaces and distances therebetween are selected to permute the divergence along the slow and fast axes of the beamlets. The contour of each surface matches the cross-sectional shape of the beamlets thereat.

16 Claims, 5 Drawing Sheets

SYMMETRIZATION DEVICE AND LASER DIODE SYSTEM PROVIDED WITH THE SAME

FILED OF THE INVENTION

The present invention relates to the field of optical components and more particularly concerns a symmetrization device for use within a laser diode system including a laser diode array.

BACKGROUND OF THE INVENTION

Laser diode arrays, both linear (so-called laser diode bars) and bi-dimensional (2-D stack of laser bars) are very attractive sources of high power laser beam. Among their advantages, they have a high conversion efficiency, a high reliability, and they can be packaged to form small laser source modules. High-power laser diode linear arrays are mostly available in the form of elongated thin laser diode bars comprising several individual laser emitters set along an axis parallel to the semiconductor PN junction of the individual diodes. A schematic drawing of a laser diode bar is sketched in FIG. 1 (PRIOR ART). Common laser diode bars comprise typically 10 to 50 individual equally spaced emitters, which spread over a total width generally set to a 10 mm standard width. Each individual emitter has typical dimensions of 50–200 µm×1 µm, and they are represented by the small hachured rectangles in FIG. 1. As seen in FIG. 1, the divergence angles of the beam escaping from a laser emitter are typically 80° FW (full width at $1/e^2$) along the direction perpendicular to the junction plane (arbitrarily designated the Y axis on the enclosed drawings), also called the fast axis, and 10° FW along the direction parallel to the junction plane (the X axis), also called the slow axis. These laser diode bars can routinely emit tens of Watts of CW optical power. When even higher optical output powers are required from the laser source, several laser diode bars can be stacked one above the other using suitable mounting means to give a two-dimensional laser diode array. The mounting means is designed to hold the laser bars firmly in place while ensuring proper electrical biasing and cooling of each bar. The resulting total output power scales directly with the number of stacked laser diode bars.

Laser diode systems are used in various applications such as machining of materials, treatment of surfaces, illumination and pumping of solid-state lasers. These various applications have different requirements on the laser beam characteristics, such as the beam's shape and divergence. One major difficulty in using laser diode systems is that the unconditioned output laser beam is rarely adapted for applications of interest. Laser beam conditioning and/or reshaping is therefore required in order to optimize the output laser beam characteristics.

The characteristics of a laser beam outputted by a laser diode are usually quantified by a value called beam product parameters, or BPP, which represents the product of the beam's width by its divergence along a given axis. Typically, the output laser beam of a laser diode bar, taken as a whole, has BPP of 0.001 mm×1400 mrad=1.4 mm·mrad along the Y axis and a BPP of 10 mm×175 mrad=1750 mm·mrad along the X axis. The BPP value along the Y axis is close to the diffraction limit value. On the other hand, the large BPP value along the X axis is indicative of a poor laser beam quality with a $M^2$ of the order of 1700 (the $M^2$ factor should be of the order of 1 for a beam of the best possible quality). This strong asymmetry in the BPP's and large $M^2$ value precludes the efficient focalisation of the laser beam to a small circular spot needed, for example, for injection to an optical fibre.

In the particular case of a laser diode bar with a relatively low fill factor (W/S ratio, see FIG. 1), several techniques have been devised to reshape the laser beam, as for example taught by J. Endriz, U.S. Pat. No. 5,168,401; S. Yamaguchi et al., U.S. Pat. No. 5,513,201; K. Du et al., U.S. Pat. No. 6,324,190; Kusuyana et al., U.S. Pat. No. 6,639,727; and Lissotschenko et al., U.S. Pat. No. 6,471,372.

These techniques share the same basic idea that each laser beamlet, i.e. the laser beam radiated by each emitter in the laser diode bar, is rotated by 90 degrees along the Z axis by the device. Either reflective (U.S. Pat. Nos. 5,168,401, 5,513,201 and 6,324,190) or refractive approaches (U.S. Pat. Nos. 5,513,201, 6,639,727 and 6,471,372) have been devised to produce this rotation. This is schematized in FIG. 2 (PRIOR ART), where a laser bar with five emitters is represented. The fast axis (Y axis) of the laser beam is collimated with a cylindrical microlens. Then, the five beamlets pass through the device which rotates each beamlet by 90 degrees around the Z axis. The asymmetric nature of the BPP of each beamlet is represented by a cross-section in the form of an elongated rectangle. The laser beam cross section at two different planes, before and after the device, takes the form represented in the dotted boxes of FIG. 2. Therefore, the total (sum) BPP of the beamlets are transformed so that the new values along the X and Y axes are related to the initial values along the Y and X axes, respectively, and reduce and increase, respectively, by time the number of rotated beamlet, that is $BPP(X) \geq$ initial $BPP(Y) \times 5$, and $BPP(Y)$=initial $BPP(X)/5$. Furthermore, the outputted laser beam's brightness, given by the optical power/(BPP(X)×BPP(Y)), will be optimized (i.e. the equality will hold in the equation above) if no empty space is left between the beamlets.

The major drawback of these techniques is that the beamlets need to be well separated before entering the rotating device, in order to minimize truncation of the beamlet's edges in the device. Therefore, this requirement precludes an efficient application of these techniques to laser diode bars with a high fill factor. In addition, it results in non-optimal laser beam brightness since significant empty spaces are left between the beamlets. Ideally, the beamlet cross section should have a height equal to the separation (pitch) between them so as to leave no empty space between them once the rotation is performed, thereby leading to an optimized output laser beam radiance.

For the reflective techniques, significant empty spaces between beamlets are required to provide enough space for the two or more reflective surfaces needed to realize the beamlet rotation. It is also the case for the refraction-based devices, which in practice consist of extended cylindrical lenses disposed side by side in close contact at a 45° angle with respect to the Y and X axes. Such an arrangement leads to beamlet's input/output aperture of diamond shape, such as schematized in FIG. 3A (PRIOR ART). The beamlets, generally having a square cross-section, experience a large clipping by going through such an optical device. This is exemplified in FIG. 3B (PRIOR ART), where the upper left and bottom right corners of the square cross section are cut-off by the diamond-shaped input/output aperture. To minimize the beamlet clipping, the horizontal extent of the beamlet's cross-section needs to be limited, as schematized in FIG. 3C (PRIOR ART). This however severely limits the laser diode bar fill factor that can be used with such device, therefore limiting its domain of application and interest.

There is therefore a need for a symmetrization device which alleviates the above-mentioned drawbacks.

SUMMARY OF THE INVENTION

In accordance with a first aspect of the present invention, there is provided a symmetrization device for an input light beam having a plurality of beamlets parallely propagating along a propagation direction, the light beam having a cross-section plane perpendicular to the propagation direction defined by perpendicular first and second axes. Each beamlet further has a cross-section shape in the cross-section plane and a divergence associated with each of the first and second axes.

The device includes a plurality of lens components disposed adjacent to each other. Each of the lens components has an input surface for receiving at least one of the beamlets transversally thereto. The input surface has a curved profile along the propagation direction and a contour in the cross-section plane. Each lens component further has an output surface for outputting the at least one beamlet, disposed in correspondence with the input surface at a predetermined distance therefrom. The output surface has a curved profile in the propagation direction and a contour in the cross-section plane.

The curved profiles of the input and output surfaces and the predetermined distance therebetween are selected to collectively permute the divergence associated with the first and second axes of the at least one beamlet, and the contours of the input and output surfaces substantially match the cross-section shape of the at least one beamlet thereat.

In accordance with another aspect of the invention, there is also provided a laser diode system for generating a light beam having a propagation direction and a cross-section plane defined by perpendicular first and second axes.

The laser diode system includes a laser diode array having a plurality of laser diodes mounted in a parallel relationship, each laser diode generating a beamlet propagating along the propagation direction and having a cross-section shape in the cross-section plane and a divergence associated with each of the first and second axes.

A beam conditioning assembly is further provided for conditioning the plurality of beamlets, the beam conditioning assembly including a symmetrization device. The symmetrization device includes a plurality of lens components disposed adjacent to each other. Each of the lens components has an input surface for receiving one of the beamlets transversally thereto. The input surface has a curved profile along the propagation direction of the beamlet, and a contour in the cross-section plane thereof. Each of the lens components also has an output surface for outputting the at least one beamlet, disposed in correspondence with the input surface at a predetermined distance therefrom. The output surface has a curved profile in the propagation direction of the at least one beamlet, and a contour in the cross-section plane thereof.

The curved profiles of the input and output surfaces and the predetermined distance therebetween are selected to collectively permute the divergence associated with the first and second axes, and the contours of the input and output surfaces generally match the cross-section shape of the at least one beamlet thereat.

Further features and advantages of the present invention will be better understood upon reading of preferred embodiments thereof with reference to the appended drawings.

DESCRIPTION OF PREFERRED EMBODIMENTS OF THE INVENTION

The present invention proposes an original design for a laser beam symmetrization device that avoids the limitations of the prior art mentioned above. In accordance with the principle of the present invention, the symmetrization device is provided with appropriate input/output apertures.

Figure 1:
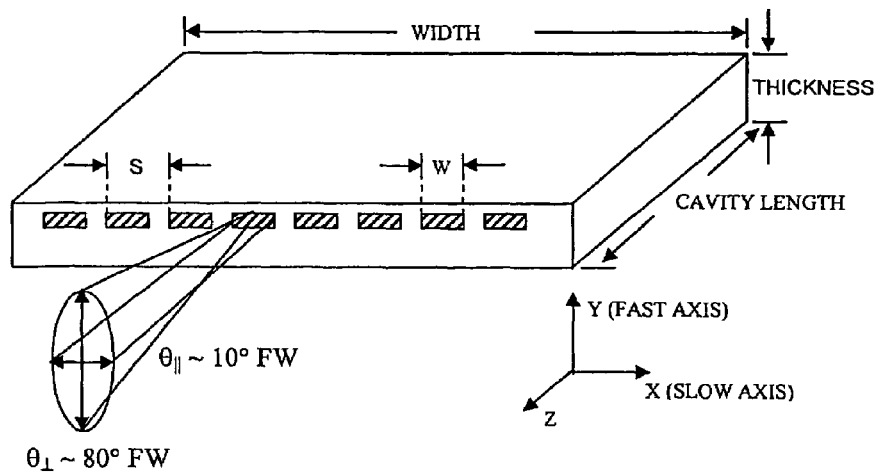
FIG. 1 (PRIOR ART) is a perspective schematized view of a laser diode bar according to prior art.
Figure 2:
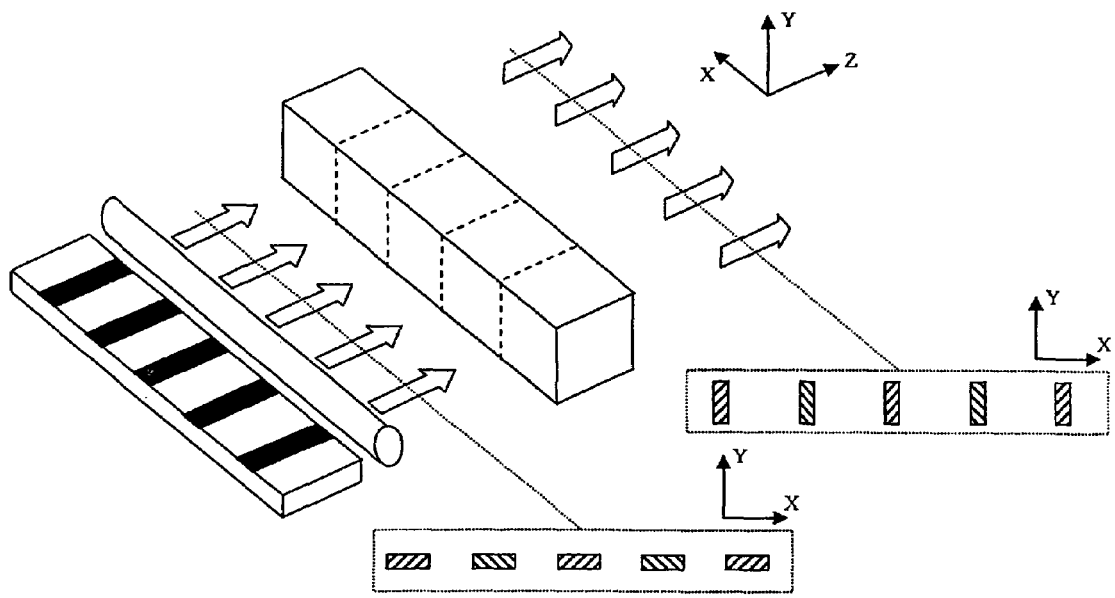
FIG. 2 (PRIOR ART) is a perspective schematized view of a laser diode system according to prior art.
Figure 3A:
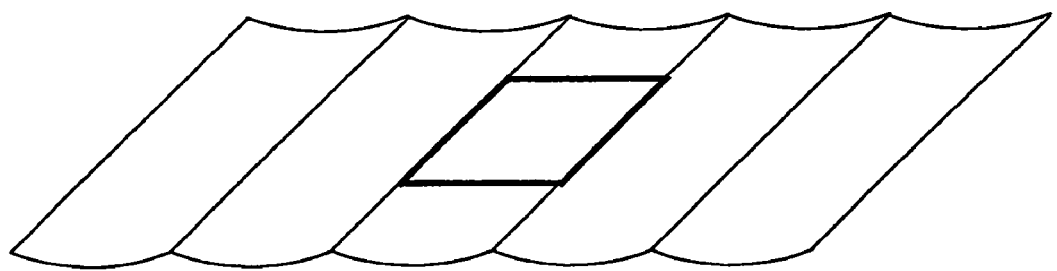
FIG. 3A (PRIOR ART) is a front view of a prior art symmetrization device showing the opening shape of the lens components.
Figure 3B:
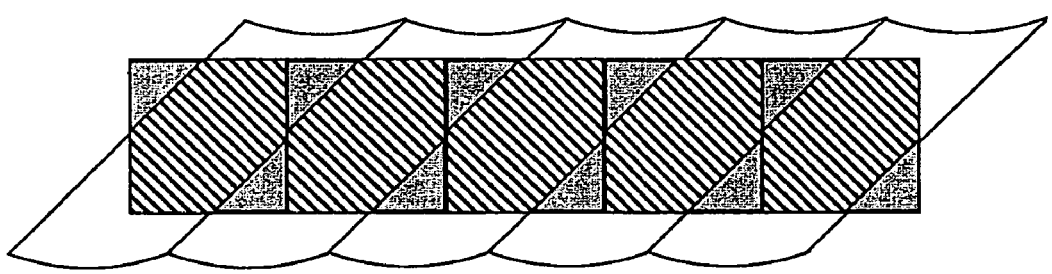
FIG. 3B (PRIOR ART) superposes the beamlets shape over the device of FIG. 3A.
Figure 3C:
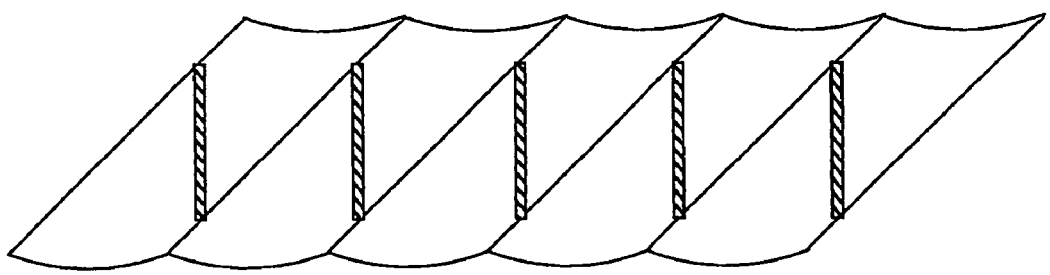
FIG. 3C (PRIOR ART) illustrates a prior art method of minimizing beamlet clipping for the device of FIG. 3A.
Figure 4A:
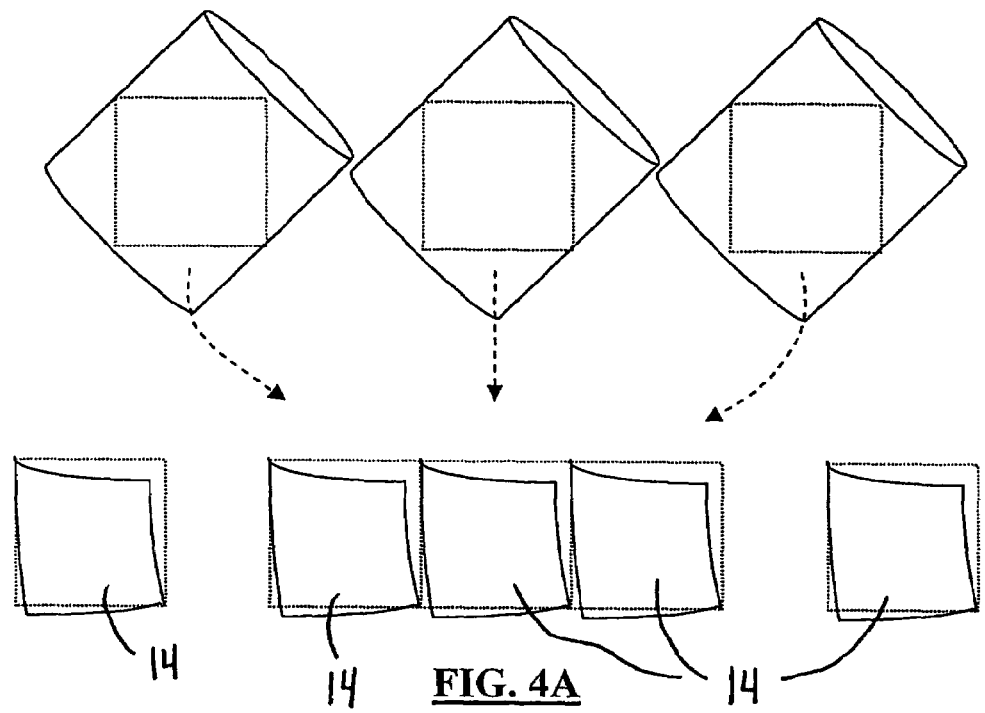
FIG. 4A is a schematized front view of a device according to a preferred embodiment of the present invention.
Figure 4B:
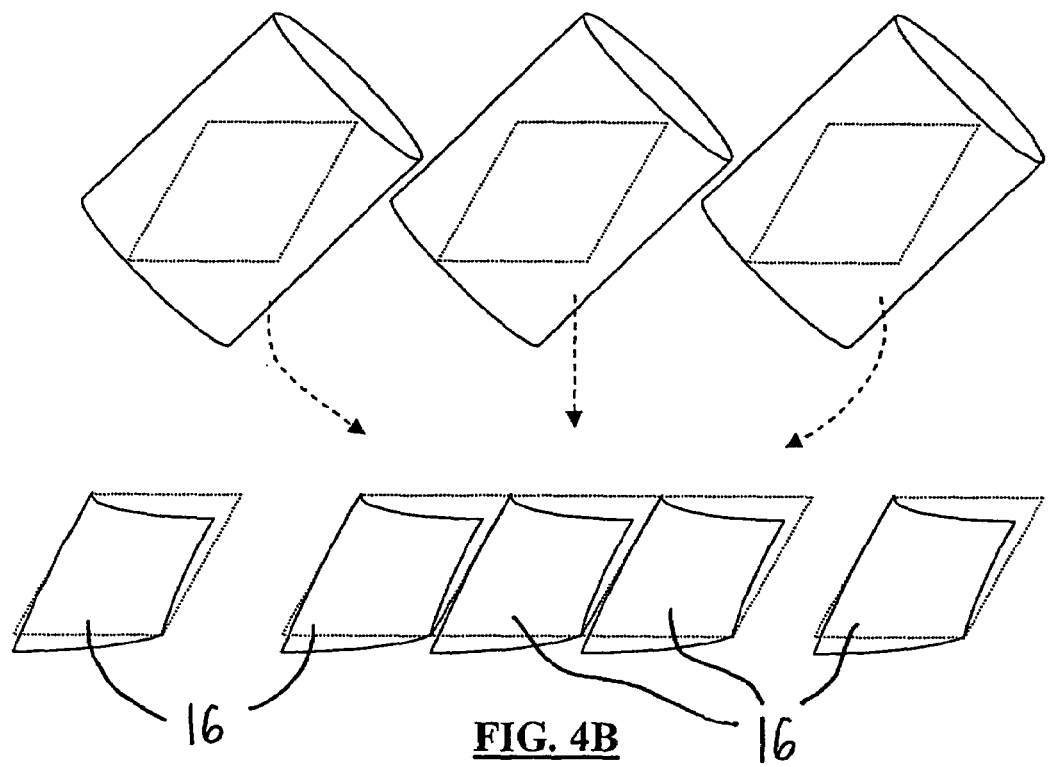
FIG. 4B is a rear view of the device of FIG. 4A.
Figure 4C:
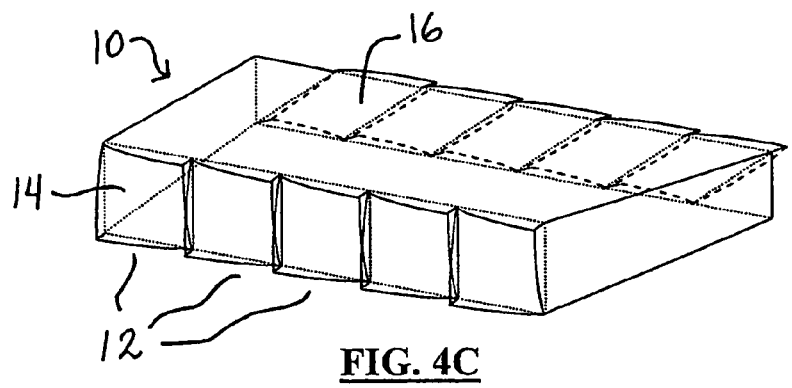
FIG. 4C is a perspective view in transparency of the device of FIG. 4A.

Referring to FIGS. 4A to 4C, there is shown a preferred embodiment of the symmetrization device 10 according to the present invention. The device 10 is understood to be destined for use with a laser diode array or any other device generating an input light beam having a plurality of parallel beamlets. Each beamlet has a propagation direction (Z) parallel to the other beamlets, and a cross-section in a plane perpendicular to the propagation direction. On the illustrated embodiments of the present invention, the cross-section plane is defined by first and second perpendicular axes (X) and (Y), which in practice generally and respectively correspond to the slow and fast axes of the laser diodes. The beamlets therefore have a different divergence associated with each of the axes (X) and (Y). Each beamlet also has a predetermined shape in the cross-section plane, which varies as a function of the position considered along the propagation direction, and is determined by the shape of the individual emitters generating these beamlets, the divergence along both axes (X) and (Y) and the beam-shaping components disposed in the beamlets' path. It is of course understood that the designations (X), (Y) and (Z) are used herein simply as a convenient frame of reference and are in no way indicative of a preferred orientation of the device.

The device 10 includes a plurality of lens components 12 disposed adjacent to each other. Each of the lens components has an input surface 14 which receives one or a few of the beamlets transversally thereto, and an output surface 16 for outputting the same. In the illustrated embodiments and description below, each lens component is associated with a single beamlet, but it is however understood that the invention could equally be applied to a case where a number of neighbouring beamlets are incident on a single lens component.

Along the propagation direction, the input and output surfaces 14 and 16 have curved profiles which are selected, along with the distance therebetween, to collectively permute the divergence associated with the first and second axes. Preferably, this is achieved by lens having a cylindrical profile inclined at about 45° with respect to the first and second axes. The present invention is however not limited to such an embodiment and any surface profiles apt to appropriately modify the beamlet could be used. The input and output surface profiles may also be designed to additionally correct the laser beam or phase front aberrations as warranted by a particular application.

Figure 7A:
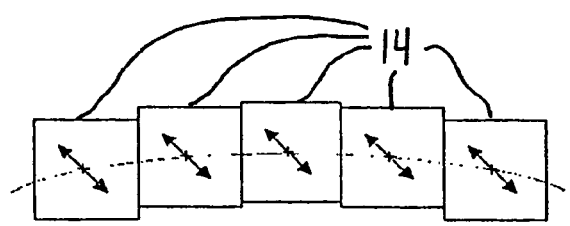
FIGS. 7A and 7B are respectively front and rear views of a device according to another embodiment of the present invention compensating for the "smile" effect of laser diodes.
Figure 7B:
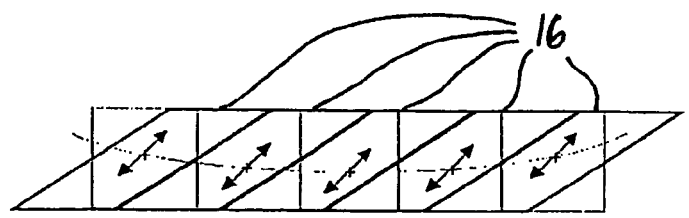

As an example of such adaptation or correction, the input surface of a given device 10 may be disposed offset with each other with respect to the Y axis. This feature provides a way to compensate for a common defect in laser diode bars known as the "smile". The smile consists in a misalignment of the bar's individual emitters. In a perfect case, they are aligned on a straight line. In non-perfect cases, the bar's emitters are aligned along a more or less pronounced curved segment, related to difficulties in the bar fabrication procedure. This smile causes problems if straight (cylindrical) optic is used, as it is generally the case. The smile can be compensated, with the present invention, by offsetting the surface profile, and therefore the optical power, defined by each input and output surfaces 14 and 16 in such a way to counterweight the offset (smile) in the bar's emitter alignment. Such an embodiment is shown in FIGS. 7A and 7B.

Extensions or contractions of the pitch of the lens components of the device, compared to the laser diode bar emitter's pitch, may also be used to optimize the output beamlet separation and, therefore, the output laser beam radiance.

In the cross-section plane, the contours of the input and output surfaces substantially match the cross-section shape of the at least one beamlet thereat. The input surface 14 of the lens components 12 is better seen in FIG. 4A, and the output surface 16 in FIG. 4B. In the top part of each drawings, individual lens components are shown separated to better illustrate the concept of the present invention, but in the actual finished device, they are adjacent as shown in the bottom part of these drawings.

In the example illustrated in FIG. 4A, the incoming beamlet at the input surface has a square-shaped contour. The input surface 14 is therefore shaped as a square-shaped section of an inclined cylindrical lens. As a result, the incoming beamlet is entirely received at the input surface 14 of the device, without any clipping, and no empty space is necessary between neighbouring lens components 12. Because of the curved profile of the input surfaces, the shape of each beamlet is modified as it enters the device and propagates therein. It therefore has the shape of a diamond when it reaches the output surface 16. This output surface is therefore given the same diamond shape, as illustrated in FIG. 4B. Each beamlet is in this manner outputted without any clipping at the output surface either. The combined effect of the curved profiles of the input and output surfaces is to modify the divergence of the beamlet in such a way that the divergence associated with the first and second axes are permuted with respect to their values in the input beamlet. As a result, the diamond shaped output beamlet will evolve as dictated by this new divergence characteristic.

Although the illustrated embodiment shows square and diamond-shaped input and output surfaces, it is understood that the present invention could be easily adapted to match beamlets of rectangular or any other cross-section. However, proper matching of the input output apertures with the transformation characteristic (surface profiles) of the device is required to avoid leaving empty space between cross-section of the output beamlets that reduced the output beam brightness, as known from prior art.

The tri-dimensional aspect of the device according to the present embodiment is shown in FIG. 4C. It is however understood that the invention is not limited to such a monolithic embodiment and that the symmetrization device could for example be the combination of aligned input and output lens blocks, or other complicated systems having appropriate input and output surfaces shapes as explained above.

The ability to adapt the transformation device input/output apertures and the surface profiles within these apertures permits to fully optimize the performance of the device. However, this leads to discontinuities in the surface profile between adjacent beamlet input/output apertures. Such non-continuous surface profile is difficult to fabricate. To alleviate this difficulty and reduce the fabrication cost, a fabrication technique based on the replication of a master form can be used.

First, the master form of the device surface profile is patterned into a photoresist film. This can be done by various means, such as, for example, by a suitable exposure of the photoresist film with a direct laser writing apparatus or by exposure through a grey scale mask with appropriate variable transmission regions, followed by standard development procedures of the exposed photoresist film. Afterwards, the master form is transferred to a suitable optical material, for example by UV-embossing in organo-ceramic compound or injection molding in thermoplastics. The surface profile of the input and output apertures can be molded on either side of a substrate or on independent substrates that would be assembled together at later time.

Therefore, the design and production complexity is restricted to the fabrication of the master form. The device itself will benefit from the low cost and mass production capability of the replication technique.

This is even the case of transformation devices permitting compensation of the laser diode bar's smile. In that case, few master forms designed to compensate smile's value around the usual one can be made and used for the fabrication of few models of the rotating device. Selection of the specific model offering the best match, for a particular laser diode bar, is part of the assembly procedure, this selection being based on an optical, mechanical or other measurement or characterization of the laser diode bar.

Figure 5A:
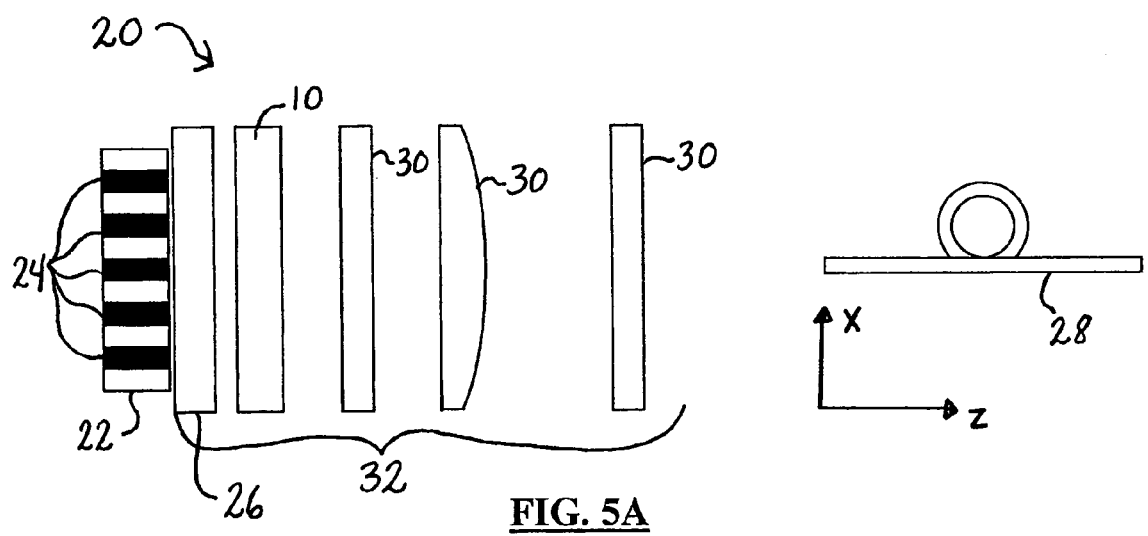
FIGS. 5A and 5B are respectively side and top views of a laser diode system including a linear laser diode array according to a first embodiment of the invention.
Figure 5B:
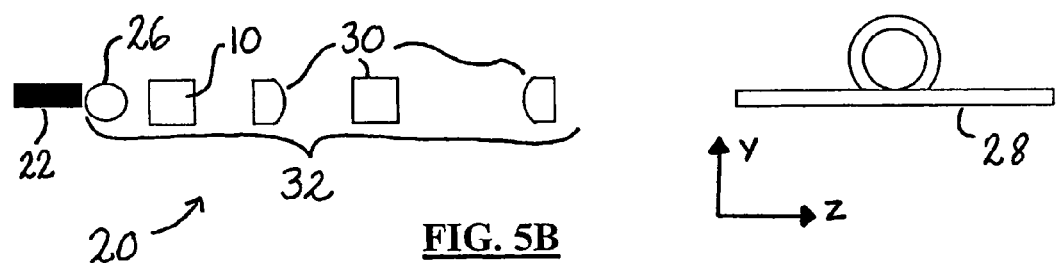

In accordance with another aspect of the invention, there is also provided a laser diode system 20 integrating a symmetrization device as explained above. An example of such a system is shown in FIGS. 5A and 5B. The system 20 first includes a laser diode array 22, which includes a plurality of parallely mounted laser diodes 24. In the illustrated embodiment, the array 22 is a linear laser diode bar as is well known in the art. Each diode 24 generates a beamlet along the propagation direction Z.

Laser diodes in laser arrays are generally shaped as a thin rectangle with its longer side extending along the X axis, which corresponds to the slow axis of the semiconductor junction. The initial shape of the beam therefore matches the shape of the diode, with typical dimensions of about 50–200 $\mu m \times 1$ $\mu m$. As explained above, the divergence angle of the generated beamlets along the fast axis (Y) is of about 80° FW, much greater than along the slow axis (X) where it is of about 10° FW. As a result, the cross-sectional shape of the beamlet will change as it propagates along the propagation direction, since its length along the Y axis will increase much faster than along the X axis, so that a gradually "thicker" rectangle is obtained. To decrease the beam divergence, it is known to place a cylindrical lens 26 at a short distance from the diode array in order to collimate the beamlet along the Y axis. The effect of this collimation is to greatly decrease the divergence along this axis, to values of the order of 0.3°, better than along the X axis.

To properly focus the beam from the entire laser diode array 22 on a waveguide such as optical fiber 28, the Beam Product Parameter (BPP) resulting from the sum of all beamlets needs to be optimized in both the X and Y directions. The initial BPP(Y), in the Y direction, depends only on the individual beamlet's length and divergence along the Y axis. The initial BBP(X) depends on the individual beamlet's length and divergence along the X axis, but will additionally be multiplied by the number of diodes (beamlets) in the X direction. It is therefore advantageous to decrease the divergence along the X axis, to correspondingly decrease the BPP therealong in order to obtain similar values for BPP(X) and BPP(Y). This transformation is achieved with a symmetrization device 10 as explained above, which will permute the divergence along the X axis with the smaller divergence along the Y axis.

The cylindrical lens 26 and symmetrization device 10 are preferably disposed in the path of the beamlets so that the cross-section of these beamlets at the input face of the symmetrization device 10 is generally square-shaped, and the input surfaces of the device 10 are given a square-shaped contour matching the shape of these beamlets. As explained above, this optimizes the brightness of the resulting signal as no empty spaces will be created by the transformation of the beamlets in the symmetrization device.

Further appropriate optical components 30 may be provided along the path of the beamlet to condition the light beam as needed for particular applications. The cylindrical lens 26, symmetrization device 10 and additional optical components 30 therefore form together a beam conditioning assembly 32.

Figure 6A:
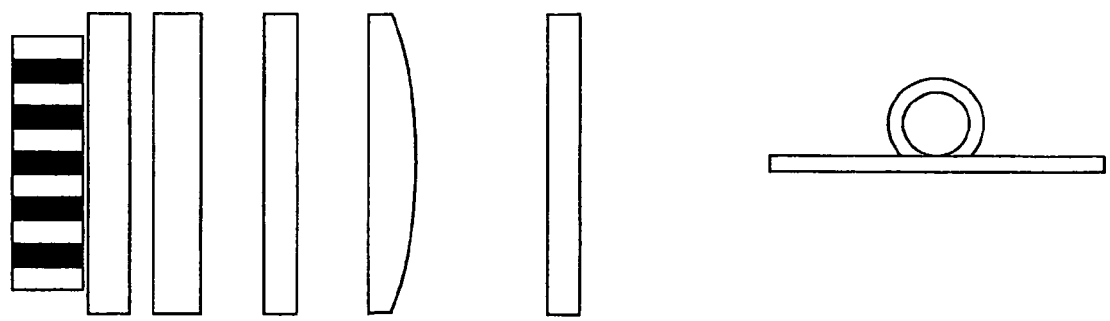
FIGS. 6A and 6B are respectively side and top views of a laser diode system including a bi-dimensional laser diode array according to a second embodiment of the invention.
Figure 6B:
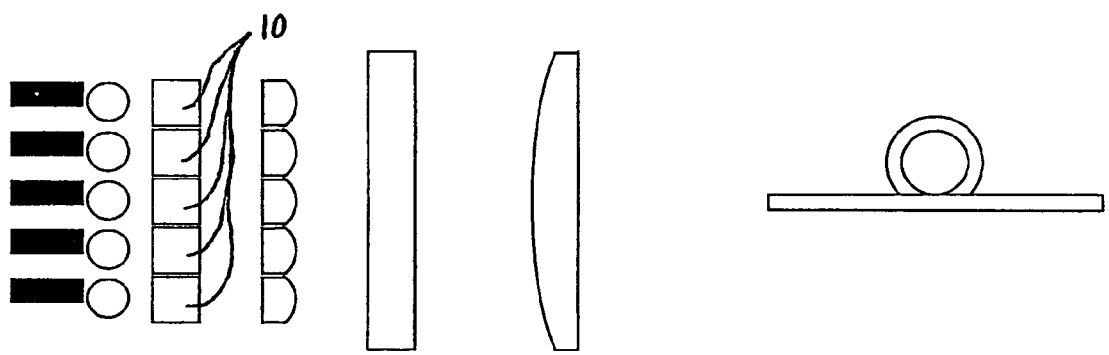

The examples discussed above showed applications of the present invention for the laser beam transformation of a single laser diode bar. Nevertheless, the present invention is not restricted to such applications and can also be beneficial for the transformation of the laser beam of 2-D array of laser diode bar, as shown in FIGS. 6A and 6B. For such an embodiment, a stack of symmetrization devices 10 as explained above may be provided, each associated with one laser diode bar of the array. In this case, proper arrangement of the bar's pitch within the array, the focal length fast axis collimating microlenses, as well as the other lenses need to be carefully selected in order to achieve adequate laser beam transformation and optimization of its brightness.

Of course, numerous modifications could be made to the embodiments above without departing from the scope of the present invention as defined in the appended claims.

The invention claimed is:

1. A symmetrization device for an input light beam having a plurality of beamlets parallely propagating along a propagation direction, said light beam having a cross-section plane perpendicular to said propagation direction defined by perpendicular first and second axes, each beamlet further having a cross-section shape in said cross-section plane and a divergence associated with each of said first and second axes, the device comprising a plurality of lens components disposed adjacent to each other, each of said lens components comprising:

an input surface for receiving at least one of said beamlets transversally thereto, the input surface having a curved profile along the propagation direction and a contour in the cross-section plane; and an output surface for outputting said at least one beamlet, disposed in correspondence with the input surface at a predetermined distance therefrom, the output surface having a curved profile in the propagation direction and a contour in the cross-section plane;

wherein the curved profiles of the input and output surfaces and the predetermined distance therebetween are selected to collectively permute the divergence associated with the first and second axes of said at least one beamlet, and the contours of the input and output surfaces substantially match the cross-section shape of said at least one beamlet thereat.

2. The symmetrization device according to claim 1, wherein the curved profile of the input and output surfaces of each said lens component is a cylindrical profile inclined at about 45° with respect to the first and second axes.

3. The symmetrization device according to claim 2, wherein the contour of each said input surface is rectangular-shaped.

4. The symmetrization device according to claim 2, wherein the contour of each said input surface is square-shaped.

5. The symmetrization device according to claim 3, wherein the contour of each said output surface is diamond-shaped.

6. The symmetrization device according to claim 1, wherein the input and output surfaces of at least one of said lens components are offset with respect to respective input and output surfaces of neighbouring lens components along one of said first and second axes.

7. A laser diode system for generating a light beam having a propagation direction and a cross-section plane defined by perpendicular first and second axes, the laser diode system comprising:

a laser diode array comprising a plurality of laser diodes mounted in a parallel relationship, each laser diode generating a beamlet propagating along said propagation direction and having a cross-section shape in said cross-section plane and a divergence associated with each of said first and second axes; and a beam conditioning assembly for conditioning said plurality of beamlets, said beam conditioning assembly comprising a symmetrization device, said symmetrization device comprising a plurality of lens components disposed adjacent to each other, each of said lens components comprising:

an input surface for receiving one of said beamlets transversally thereto, the input surface having a curved profile along the propagation direction of said beamlet, and a contour in the cross-section plane thereof; and an output surface for outputting said beamlet, disposed in correspondence with the input surface at a predetermined distance therefrom, the output surface having a curved profile in the propagation direction of said beamlet, and a contour in the cross-section plane thereof;

wherein the curved profiles of the input and output surfaces and the predetermined distance therebetween are selected to collectively permute the divergence associated with the first and second axes, and the contours of the input and output surfaces generally match the cross-section shape of said beamlet thereat.

8. The laser diode system according to claim 7, wherein the curved profile of the input and output surfaces of each said lens component of the symmetrization device is a cylindrical profile inclined at about 45° with respect to the first and second axes.

9. The laser diode system according to claim 8, wherein the contour of each said input surface of the symmetrization device is rectangular-shaped.

10. The laser diode system according to claim 8, wherein the contour of each said input surface of the symmetrization device is square-shaped.

11. The laser diode system according to claim 9, wherein the contour of each said output surface of the symmetrization device is diamond-shaped.

12. The laser diode system according to claim 7, wherein:
at least two of the laser diodes of said array are offset with respect to each other; and
the respective input and output surfaces of the lens components receiving beamlets from said at least two of the laser diodes are offset with respect to each other to compensate for the offset of said at least two of the laser diodes.

13. The laser diode system according to claim 7, wherein said laser array is linear.

14. The laser diode system according to claim 13, wherein:
the laser diodes of said laser diode array define a curved shape along the one of said first and second axes; and
the input and output surfaces of the lens components of said symmetrization device are positioned to respectively define a curved shape along said one of the first and second axes to compensate for said curved shape of the laser diode array.

15. The laser diode system according to claim 7, wherein said laser array is bi-dimensional.

16. The laser diode system according to claim 7, wherein said beam conditioning assembly further comprises a collimation component disposed between the laser diode array and the symmetrization device for collimating said beamlet along one of said first and second axes.

* * * * *